(12) United States Patent
Wen et al.

(10) Patent No.: US 10,469,037 B2
(45) Date of Patent: Nov. 5, 2019

(54) MULTI-STAGE AMPLIFIER CIRCUIT WITH ZERO AND POLE INSERTED BY COMPENSATION CIRCUITS

(71) Applicant: MEDIATEK INC., Hsin-Chu (TW)

(72) Inventors: Sung-Han Wen, Taipei (TW); Kuan-Ta Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/912,448

(22) Filed: Mar. 5, 2018

(65) Prior Publication Data
US 2018/0309416 A1  Oct. 25, 2018

Related U.S. Application Data

(60) Provisional application No. 62/487,013, filed on Apr. 19, 2017.

(51) Int. Cl.
*H03F 1/14* (2006.01)
*H03F 1/42* (2006.01)
(Continued)

(52) U.S. Cl.
CPC .............. *H03F 1/42* (2013.01); *H03F 1/083* (2013.01); *H03F 1/086* (2013.01); *H03F 1/14* (2013.01); *H03F 1/34* (2013.01); *H03F 3/21* (2013.01); *H03F 3/45179* (2013.01); *H03F 3/45475* (2013.01); *H03F 2200/153* (2013.01); *H03F 2200/408* (2013.01); *H03F 2200/456* (2013.01)

(58) Field of Classification Search
CPC .................. H03F 1/14; H03F 1/34; H03F 1/56

USPC ............................ 330/98, 99, 100, 107, 292
See application file for complete search history.

(56) References Cited

U.S. PATENT DOCUMENTS 1,784,857 A * 12/1930 Von Ardenne ......... H04B 1/163
329/367
6,150,884 A   11/2000 Fattaruso
(Continued)

FOREIGN PATENT DOCUMENTS

CN    104734646 A   6/2015
EP    3 021 482 A1  5/2016

OTHER PUBLICATIONS

Aaron S. Tucker et al., Biocompatible, High Precision, Wideband, Improved Howland Current Source With Lead-Lag Compensation, IEEE Transactions on Biomedical Circuits and Systems, vol. 7, No. 1, Feb. 2013, pp. 63-70, XP011495378.
(Continued)

*Primary Examiner* — Steven J Mottola
(74) *Attorney, Agent, or Firm* — Winston Hsu

(57) ABSTRACT

An amplifier circuit has a multi-stage amplifier, a compensation capacitor, and compensation circuits. The multi-stage amplifier has amplifiers cascaded between an input port and an output port of the multi-stage amplifier. The amplifiers include at least a first-stage amplifier, a second-stage amplifier and a third-stage amplifier. The compensation capacitor is coupled between the output port of the multi-stage amplifier and an output port of the first-stage amplifier. The compensation circuits include a first compensation circuit and a second compensation circuit. The first compensation circuit is coupled to the output port of the first-stage amplifier. The second compensation circuit is coupled to an output port of the second-stage amplifier.

14 Claims, 8 Drawing Sheets

(51) Int. Cl.
*H03F 1/08* (2006.01)
*H03F 3/45* (2006.01)
*H03F 1/34* (2006.01)
*H03F 3/21* (2006.01)

(56) References Cited

U.S. PATENT DOCUMENTS

| | | | |
|---|---|---|---|
| 6,208,206 | B1 | 3/2001 | Leung |
| 6,621,334 | B2 | 9/2003 | Ausserlechner |
| 7,459,972 | B2 | 12/2008 | Aram |
| 7,777,464 | B2 | 8/2010 | Jung |
| 8,963,639 | B2 | 2/2015 | Yan |
| 9,104,218 | B2 | 8/2015 | Bhattad |
| 9,680,420 | B2 | 6/2017 | Yuan |
| 9,768,740 | B2 | 9/2017 | Zhang |
| 2007/0018621 | A1 | 1/2007 | Mok |
| 2011/0234312 | A1 | 9/2011 | Lachhwani |
| 2017/0222610 | A1 | 8/2017 | Ivanov |

OTHER PUBLICATIONS

Bob Cordell, Chapter 9 Advanced Forms of Feedback Compensation, Designing Audio Power Amplifiers, 2011, cover pages & pp. 171-183, McGraw-Hill, XP002784534.

Leung, Three-Stage Large Capacitive Load Amplifier with Damping-Factor-Control Frequency Compensation, IEEE Transactions on Solid-State Circuits, vol. 35, No. 2, pp. 221-230, Feb. 2000.

Galal, A 60 mW Class-G Stereo Headphone Driver for Portable Battery-Powered Devices, IEEE Journal of Solid-State Circuits, vol. 47, No. 8, pp. 1921-1934, Aug. 2012.

Dhanasekaran, Design of Three-Stage Class-AB 16 Ohm Headphone Driver Capable of Handling Wide Range of Load Capacitance, IEEE Journal of Solid-State Circuits, vol. 44, No. 6, pp. 1734-1744, Jun. 2009.

Xiaohong Peng et al., AC Boosting Compensation Scheme for Low-Power Multistage Amplifiers, IEEE Journal of Solid-State Circuits, IEEE Service Center, Piscataway, NJ, USA, vol. 39, No. 11, Nov. 1, 2004, pp. 2074-2079, XP011121139.

\* cited by examiner

MULTI-STAGE AMPLIFIER CIRCUIT WITH ZERO AND POLE INSERTED BY COMPENSATION CIRCUITS

CROSS REFERENCE TO RELATED APPLICATIONS

This application claims the benefit of U.S. provisional application No. 62/487,013, filed on Apr. 19, 2017 and incorporated herein by reference.

BACKGROUND

The present invention relates to an amplifier design, and more particularly, to a multi-stage amplifier circuit with at least a zero and a pole inserted by compensation circuits.

The performance obtainable from a single-stage amplifier is often insufficient for many applications. Therefore, a multi-stage amplifier may be used to achieve the desired performance by cascading several amplifier stages. Taking a three-stage amplifier for example, an output of the first-stage amplifier is used as an input of the second-stage amplifier, and an output of the second-stage amplifier is used as an input of the third-stage amplifier. To suppress the thermal noise, the first-stage amplifier with large transconductance may be employed. However, the unity-gain bandwidth/unity-gain frequency is positively correlated with the transconductance of the first-stage amplifier. In other words, the larger is the transconductance of the first-stage amplifier, the unity-gain frequency is higher and the unity-gain bandwidth is larger. Frequencies at which two high-frequency non-dominant poles of the three-stage amplifier are located may be lower than the unity-gain frequency under a condition that the first-stage amplifier is configured to have large transconductance. Consequently, the three-stage amplifier becomes unstable.

The unity-gain bandwidth/unity-gain frequency is negatively correlated with the Miller capacitance. To address the stability issue, one solution is to increase the Miller capacitance, thereby lowering the unity-gain frequency and reducing the unity-gain bandwidth to achieve stability improvement. However, the dominant pole is also negatively correlated with the Miller capacitance. As a result, the dominant pole is moved to a lower frequency, thus resulting in in-band gain degradation. Consequently, the three-stage amplifier with large Miller capacitance may have poor in-band signal quality.

Thus, there is a need for an innovative frequency compensation design which is capable of enhancing stability of a multi-stage amplifier circuit without degrading the in-band gain of the multi-stage amplifier circuit.

SUMMARY

One of the objectives of the claimed invention is to provide a multi-stage amplifier circuit with at least a zero and a pole inserted by compensation circuits.

According to a first aspect of the present invention, an exemplary amplifier circuit is disclosed. The exemplary amplifier circuit includes a multi-stage amplifier, a compensation capacitor, and a plurality of compensation circuits. The multi-stage amplifier comprises a plurality of amplifiers cascaded between an input port and an output port of the multi-stage amplifier. The amplifiers comprise at least a first-stage amplifier, a second-stage amplifier and a third-stage amplifier. The compensation capacitor is coupled between the output port of the multi-stage amplifier and an output port of the first-stage amplifier. The compensation circuits comprise a first compensation circuit and a second compensation circuit. The first compensation circuit is coupled to the output port of the first-stage amplifier. The second compensation circuit is coupled to an output port of the second-stage amplifier.

According to a second aspect of the present invention, an exemplary compensation circuit is disclosed. The exemplary compensation circuit includes a high-pass filter (HPF), an auxiliary amplifier, a capacitor, and a resistor. The HPF has an input port and an output port. The auxiliary amplifier has an input port coupled to the output port of the HPF. The capacitor is coupled between the input port of the HPF and the output port of the auxiliary amplifier. The resistor is coupled between the output port of the auxiliary amplifier and a bias voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
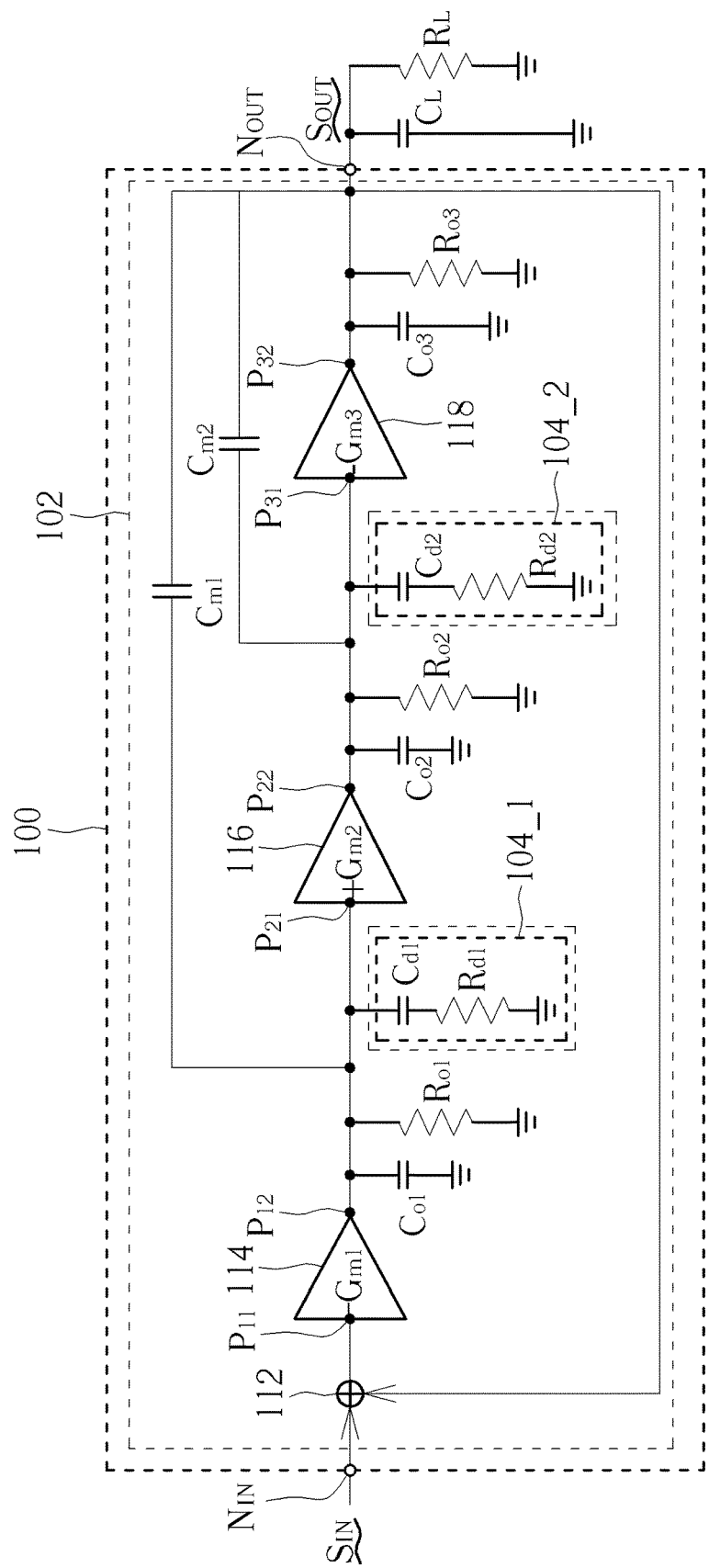
FIG. 1 is a diagram illustrating an amplifier circuit according to an embodiment of the present invention.

FIG. 1 is a diagram illustrating an amplifier circuit according to an embodiment of the present invention. By way of example, but not limitation, the amplifier circuit 100 may be used in an audio application. As shown in FIG. 1, the amplifier circuit 100 is a multi-stage amplifier circuit including a multi-stage amplifier (e.g., a three-stage amplifier 102), a plurality of compensation circuits (e.g., a first compensation circuit 104_1 and a second compensation circuit 104_2), and a plurality of compensation capacitors (e.g., $C_{m1}$ and $C_{m2}$). Each of the compensation capacitors $C_{m1}$ and $C_{m2}$ is used for Miller compensation. Hence, a nested Miller compensation (NMC) scheme may be implemented using the compensation capacitors $C_{m1}$ and $C_{m2}$. However, this is for illustrative purposes only, and is not meant to be a limitation of the present invention. In some embodiments of the present invention, the compensation capacitor $C_{m2}$ may be optional. For example, regarding the proposed frequency compensation (unity-gain-bandwidth control) scheme, the compensation capacitor $C_{m2}$ may be omitted, depending upon the actual design considerations.

The three-stage amplifier 102 has three amplifiers, including a first-stage amplifier 114, a second-stage amplifier 116 and a third-stage amplifier 118, cascaded between an input port $N_{IN}$ and an output port $N_{OUT}$ of the three-stage amplifier 102. For example, the first-stage amplifier 114 serves as an input stage of the three-stage amplifier 102, and the third-stage amplifier 118 serves as an output stage of the third-stage amplifier 118. In addition, a combining circuit 112 is used to generate an input signal fed into an input port $P_{11}$ of the first-stage amplifier 114 by combining a source signal $S_{IN}$ received at the input port $N_{IN}$ and a feedback signal derived from an output signal $S_{OUT}$ generated at the output port $N_{OUT}$. The transconductance of the first-stage amplifier 114 is denoted by $G_{m1}$, the transconductance of the second-stage amplifier 116 is denoted by $G_{m2}$, and the transconductance of the third-stage amplifier 118 is denoted by $G_{m3}$. It should be noted that, in order to obtain negative capacitive feedback loops by compensation capacitors $C_{m1}$ and $C_{m2}$, gains of the first-stage amplifier 114, the second-stage amplifier 116, and the third-stage amplifier 118 in this embodiment are negative, positive, and negative, respectively. Further, the output resistance and the output capacitance of the first-stage amplifier 114 are denoted by $R_{o1}$ and $C_{o1}$, respectively; the output resistance and the output capacitance of the second-stage amplifier 116 are denoted by $R_{o2}$ and $C_{o2}$, respectively; and the output resistance and the output capacitance of the third-stage amplifier 118 are denoted by $R_{o3}$ and $C_{o3}$, respectively. The load driven by the amplifier circuit 100 is modeled by load capacitance $C_L$ and load resistance $R_L$.

The compensation capacitor $C_{m1}$ is coupled between the output port $N_{OUT}$ of the three-stage amplifier 102 (which is also coupled to an output port $P_{32}$ of the third-stage amplifier 118) and an output port $P_{12}$ of the first-stage amplifier 114 (which is also coupled to an input port $P_{21}$ of the second-stage amplifier 116). The optional compensation capacitor $C_{m2}$ is coupled between the output port $N_{OUT}$ of the three-stage amplifier 102 (which is also coupled to the output port $P_{32}$ of the third-stage amplifier 118) and the output port $P_{22}$ of the second-stage amplifier 116 (which is also coupled to an input port $P_{31}$ of the third-stage amplifier 118).

In this embodiment, the first compensation circuit 104_1 is coupled to the output port $P_{12}$ of the first-stage amplifier 114, and the second compensation circuit 104_2 is coupled to the output port $P_{22}$ of the second-stage amplifier 116. For example, the first compensation circuit 104_1 and/or the second compensation circuit 104_2 may be implemented using damping-factor-control (DFC) circuits. Hence, the first compensation circuit 104_1 may be modeled by a capacitor $C_{d1}$ and a resistor $R_{d1}$, and/or the second compensation circuit 104_2 may be modeled by a capacitor $C_{d2}$ and a resistor $R_{d2}$. For a low-frequency signal, the capacitor $C_{d2}$ is open-circuited, thereby disconnecting the resistor $R_{d2}$ from the three-stage amplifier 102. For a high-frequency signal, the capacitor $C_{d2}$ is short-circuited, thereby connecting the resistor $R_{d2}$ to the three-stage amplifier 102 to reduce the gain of the second-stage amplifier. Because the resistance of the resistor $R_{d1}$ may be very small, the first compensation circuit 104_1 may present the capacitance of the capacitor $C_{d1}$ to the three-stage amplifier 102 for either low-frequency or high-frequency signals.

The key feature of the proposed amplifier circuit 100 is using multiple compensation circuits for achieving frequency compensation (e.g., unity-gain-bandwidth control). Different from the traditional damping factor control frequency compensation, the first compensation circuit 104_1 and the second compensation circuit 104_2 are arranged to insert at least a zero and a pole, where an open-loop gain of the amplifier circuit 100 is larger than one (i.e., 0 dB) at each of the zero and the pole. That is, when a frequency of the source signal $S_{IN}$ is equal to the frequency of the inserted zero/pole, the open-loop gain of the amplifier circuit 100 is larger than 0 dB.

In the following, a symbol of a capacitor may also denote the capacitance of the capacitor, and a symbol of a resistor may also denote the resistance of the resistor. For example, the compensation capacitor $C_{m2}$ may be regarded as having a capacitance value $C_{m2}$; and the resistor $R_{d1}$ may be regarded as having a resistance value $R_{d1}$.

Figure 2:
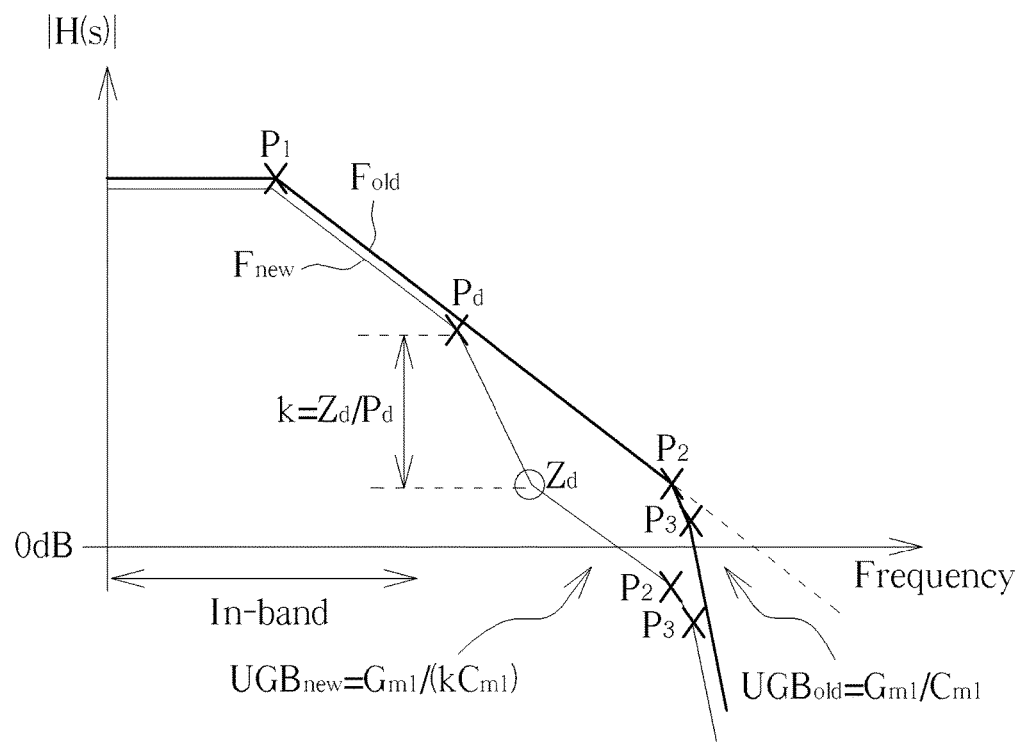
FIG. 2 is a diagram illustrating a concept of the proposed frequency compensation (unity-gain-bandwidth control) scheme according to an embodiment of the present invention.

FIG. 2 is a diagram illustrating a concept of the proposed frequency compensation (unity-gain-bandwidth control) scheme according to an embodiment of the present invention. In a case where the amplifier circuit 100 shown in FIG. 1 is modified to omit the first compensation circuit 104_1 and the second compensation circuit 104_2, the modified amplifier circuit without the proposed frequency compensation (unity-gain-bandwidth control) has the frequency response curve $F_{old}$ as illustrated in FIG. 2, where each pole is represented by a cross symbol. In another case where the first compensation circuit 104 1 and the second compensation circuit 104_2 are both used by the amplifier circuit 100 shown in FIG. 1 for insertion of one zero $Z_d$ and one pole $P_d$ according to the proposed frequency compensation (unity-gain-bandwidth control) scheme, the amplifier circuit 100 has the frequency response curve $F_{new}$ as illustrated in FIG. 2, where each pole is represented by a cross symbol, and each zero is represented by a circle symbol. An open-loop transfer function of an amplifier circuit is denoted by H(s). Hence, the open-loop gain of the amplifier circuit may be represented by $|H(s)|$.

Concerning a case where the amplifier circuit 100 is modified to omit the first compensation circuit 104_1 and the second compensation circuit 104_2, the modified three-stage amplifier circuit has three poles, including one low-frequency dominant pole $P_1$ and two high-frequency non-dominant poles $P_2$ and $P_3$. The unity-gain bandwidth/unity-gain frequency is determined by the transconductance $G_{m1}$ of the first-stage amplifier 114 divided by the capacitance of the compensation capacitor $C_{m2}$. Hence, the unity-gain bandwidth $UGB_{old}$ is equal to $G_{m1}/C_{m2}$. As mentioned above, to suppress the thermal noise, the first-stage amplifier with large transconductance may be employed. However, the larger is the transconductance of the first-stage amplifier, the unity-gain frequency is higher and the associated unity-gain bandwidth is larger. As illustrated by the frequency response curve $F_{old}$ in FIG. 2, frequencies of two high-frequency non-dominant poles $P_2$ and $P_3$ are both lower than the unity-gain frequency. In other words, the open-loop gain of the modified three-stage amplifier circuit without the proposed frequency compensation (unity-gain-bandwidth control) is larger than one (i.e., 0 dB) at each of the high-frequency non-dominant poles $P_2$ and $P_3$. Consequently, the modified three-stage amplifier circuit without the proposed frequency compensation (unity-gain-bandwidth control) becomes unstable.

In accordance with the proposed frequency compensation (unity-gain-bandwidth control) scheme, the first compensation circuit 104_1 and the second compensation circuit 104_2 are added to insert one zero (e.g., mid-frequency zero) $Z_d$ and one non-dominant pole (e.g., mid-frequency non-dominant pole) $P_d$. As shown in FIG. 2, the frequency of the non-dominant pole $P_d$ is lower than the frequency of the zero $Z_d$. In this way, the unity-gain bandwidth is shrunk by a shrink factor k, where $k=Z_d/P_d$. Specifically, the unity-gain bandwidth $UGB_{new}$ is equal to $G_{m1}/(k*C_{m2})$. As mentioned above, to suppress the thermal noise, the first-stage amplifier with large transconductance may be employed, which results in an increase of the unity-gain bandwidth. However, due to insertion of the non-dominant pole $P_d$ and the zero $Z_d$, the unity-gain bandwidth $UGB_{new}$ can be precisely controlled under a condition that the transconductance $G_{m1}$ of the first-stage amplifier 114 is large for thermal noise suppression. More specifically, the ratio of the frequency of the inserted zero $Z_d$ to the frequency of the inserted non-dominant pole $P_d$ (i.e., shrink factor k) can be properly controlled to regulate the unity-gain bandwidth $UGB_{new}$, thereby ensuring that a stability criterion of the amplifier circuit 100 is satisfied.

As illustrated by the frequency response curve $F_{new}$ in FIG. 2, two high-frequency non-dominant poles $P_2$ and $P_3$ are both at frequencies higher than the unity-gain frequency. In other words, the open-loop gain of the amplifier circuit 100 with the proposed frequency compensation (unity-gain-bandwidth control) is smaller than one (i.e., 0 dB) at each of the high-frequency non-dominant poles $P_2$ and $P_3$. In this way, the amplifier circuit 100 with the proposed frequency compensation (unity-gain-bandwidth control) is unconditionally stable in a closed-loop operation due to the zero $Z_d$ and the non-dominant pole $P_d$ inserted by the first compensation circuit 104_1 and the second compensation circuit 104_2.

The unity-gain bandwidth/unity-gain frequency is negatively correlated with the capacitance of the compensation capacitor $C_{m1}$ connected between the output port $N_{out}$ of the amplifier circuit 100 and the output port $P_{12}$ of the first-stage amplifier 114. In addition, the low-frequency dominant pole $P_1$ is also negatively correlated with the capacitance of the compensation capacitor $C_{m1}$ connected between the output port $N_{out}$ of the amplifier circuit 100 and the output port $P_{12}$ of the first-stage amplifier 114. Since the unity-gain bandwidth can be shrunk sufficiently by the shrink factor k controlled by the zero $Z_d$ and the non-dominant pole $P_d$, the stability of the amplifier circuit 100 can be ensured without increasing the capacitance of the compensation capacitor $C_{m1}$. In other words, the frequency of the dominant pole $P_1$ may remain unchanged, thus avoiding in-band gain degradation resulting from moving the dominant pole $P_1$ to a lower frequency.

To put it simply, the amplifier circuit 100 with the proposed frequency compensation (unity-gain-bandwidth control) achieved by insertion of the zero $Z_d$ and the non-dominant pole $P_d$ can be unconditionally stable with no in-band gain degradation.

Figure 3:
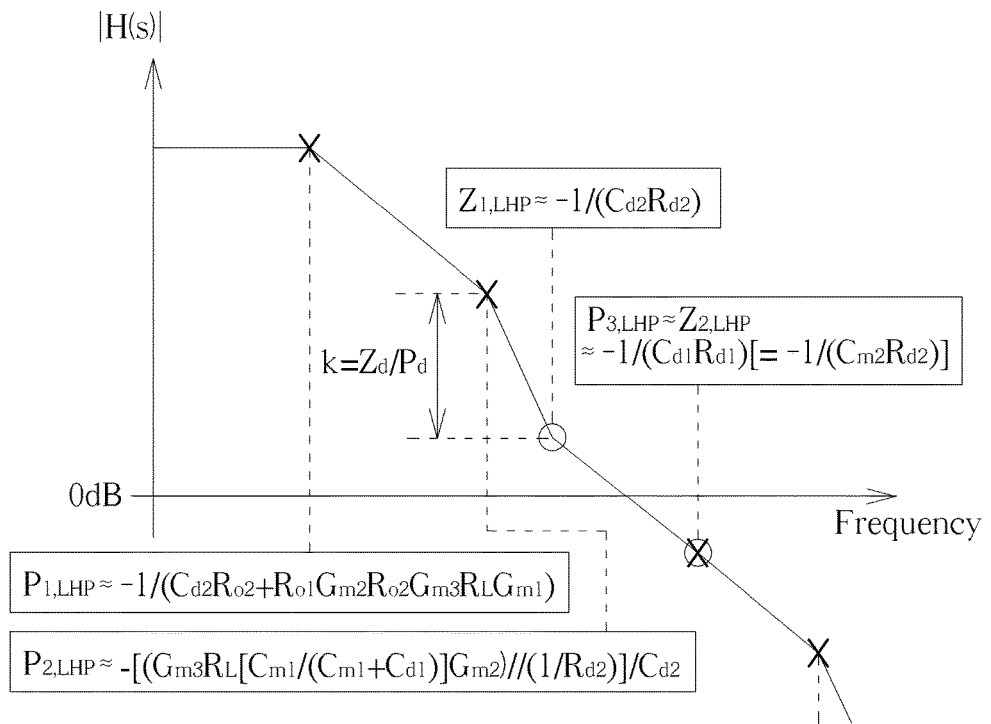
FIG. 3 is a diagram illustrating a detailed frequency response curve of the amplifier circuit shown in FIG. 1 according to an embodiment of the present invention.

Please refer to FIG. 1 in conjunction with FIG. 3. FIG. 3 is a diagram illustrating a detailed frequency response curve of the amplifier circuit 100 shown in FIG. 1 according to an embodiment of the present invention. The aforementioned dominant pole $P_1$ is denoted by $P_{1,LHP}$ in FIG. 3, the aforementioned non-dominant pole $P_d$ is denoted by $P_{2,LHP}$ in FIG. 3, and the aforementioned zero $Z_d$ is denoted by $Z_{1,LHP}$ in FIG. 3. As can be seen from FIG. 3, the inserted zero $Z_{1,LHP}$ is mainly controlled by capacitance of the capacitor $C_{d2}$ and resistance of the resistor $R_{d2}$, and the inserted non-dominant pole $P_{2,LHP}$ is at least controlled by capacitance of the capacitor $C_{d1}$, capacitance of the capacitor $C_{d2}$ and resistance of the resistor $R_{d2}$. The shrink factor k ($k=Z_d/P_d$) may be expressed using following equations.

$$k = \frac{\frac{1}{R_{d2}C_{d2}}}{\left[\frac{1}{G_{m3}R_L[C_{m1}/(C_{d1}+C_{m1})]G_{m2}} + R_{d2}\right]C_{d2}}$$
$$= 1 + \frac{1}{G_{m3}R_L[C_{m1}/(C_{d1}+C_{m1})]G_{m2}R_{d2}}$$
$$= 1 + \frac{[(C_{d1}+C_{m1})/C_{m1}]}{G_{m3}R_L(G_{m2}/G_{d2})} \approx 1 + \frac{[(C_{d1}+C_{m1})/C_{m1}]}{G_{m2}/G_{d2}}, \text{ where}$$

$$G_{m3} \approx 1/R_L, R_{d2} = G_{d2}$$

Hence, the shrink factor k depends on capacitance of capacitor $C_{d1}$, capacitance of compensation capacitor $C_{m1}$, resistance of resistor $R_{d2}$, and transconductance $G_{m2}$ of second-stage amplifier 116. The shrink factor k can be set by a value larger than one (i.e., k>1) for stability enhancement, and can be precisely controlled by capacitance of capacitor $C_{d1}$, capacitance of compensation capacitor $C_{m1}$, resistance of resistor $R_{d2}$, and transconductance $G_{m2}$ of second-stage amplifier 116. In this embodiment, the shrink factor k should be controlled to provide enough in-band phase margin (PM) for making the amplifier circuit 100 unconditionally stable in a closed-loop operation. For example, the shrink factor k may be set by a value less than 10 (i.e., k<10) to make the in-band PM larger than 35 degrees. However, this is for illustrative purposes only, and is not meant to be a limitation of the present invention.

As shown in FIG. 3, one high-frequency non-dominant pole $P_{3,LHP}$ depends on the capacitance of the compensation capacitor $C_{m2}$ and the resistance of the resistor $R_{d2}$, and another zero (e.g., high-frequency zero) $Z_{2,LHP}$ depends on the capacitance of the capacitor $C_{d1}$ and the resistance of the resistor $R_{d1}$. With proper settings of the capacitance of the compensation capacitor $C_{m2}$, the resistance of the resistor $R_{d2}$, the capacitance of the capacitor $C_{d1}$ and the resistance of the resistor $R_{d1}$, the high-frequency non-dominant pole $P_{3,LHP}$ may be cancelled by the high-frequency zero $Z_{2,LHP}$.

Figure 4:
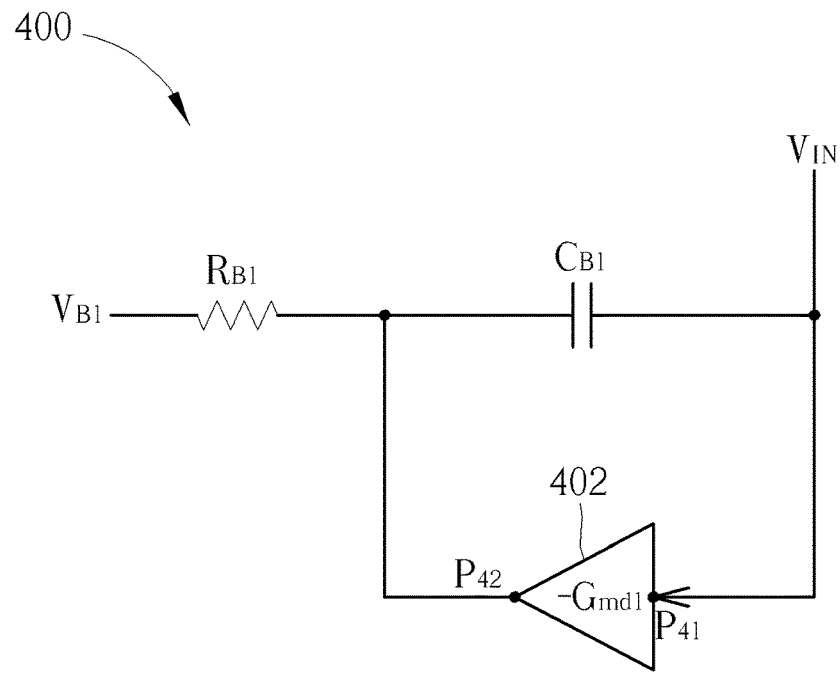
FIG. 4 is a diagram illustrating a first compensation circuit design according to an embodiment of the present invention.

FIG. 4 is a diagram illustrating a first compensation circuit design according to an embodiment of the present invention. The compensation circuit 400 includes an auxiliary amplifier 402 with transconductance $G_{md1}$ a capacitor $C_{B1}$, and a resistor $R_{B1}$. In this embodiment, the gain of the auxiliary amplifier 402 is negative. An input port $P_{41}$ of the auxiliary amplifier 402 is coupled to an input $V_{IN}$ of the compensation circuit 400. The capacitor $C_{B1}$ is coupled between the input port $P_{41}$ and the output port $P_{42}$ of the auxiliary amplifier 402. The resistor $R_{B1}$ is coupled between the output port $P_{42}$ of the auxiliary amplifier 402 and a bias voltage $V_{B1}$ (e.g., a ground voltage). The compensation circuit 400 has high input impedance due to the fact that the input $V_{IN}$ of the compensation circuit 400 is coupled to the input port $P_{41}$ of the auxiliary amplifier 402 (e.g., a gate of an input transistor in the auxiliary amplifier 402). Regarding the amplifier circuit 100 shown in FIG. 1, high impedance is required at an output of the first-stage amplifier 114 (i.e., an input of the second-stage amplifier 116) for low noise injection. Hence, the first compensation circuit 104_1 may be implemented using the compensation circuit 400 shown in FIG. 4, where the input $V_{IN}$ of the compensation circuit 400 is coupled to the output port $P_{12}$ of the first-stage amplifier 114.

The compensation circuit 400 uses a capacitance multiplication technique. Hence, the compensation circuit 400 may be regarded as having capacitance equal to $G_{md1}*C_{B1}*R_{B1}$. In addition, the compensation circuit 400 may be regarded as having resistance equal to $$\frac{1}{G_{md1}}.$$

When the first compensation circuit 104_1 is implemented using the compensation circuit 400 shown in FIG. 4, $C_{d1}=G_{md1}*C_{B1}*R_{B1}$ and $$R_{d1} = \frac{1}{G_{md1}}.$$

The transconductance $G_{md1}$ of the auxiliary amplifier 402 may be set by a large value to make the capacitor $C_{d1}$ has a large capacitance value. However, amplifier saturation may occur when a small-swing in-band signal at the input $V_{IN}$ of the compensation circuit 400 is amplified by the auxiliary amplifier 402 with large transconductance $G_{md1}$. As a result, the compensation circuit 400 may fail to perform the capacitance multiplication function, needed by the first compensation circuit 104_1 when the in-band signal swing at the input $V_{IN}$ of the compensation circuit 400 exceeds a small signal range of the auxiliary amplifier 402 with large transconductance $G_{md1}$. To increase the in-band signal range of the compensation circuit 400 having the auxiliary amplifier 402 with large transconductance $G_{md1}$, the present invention proposes another compensation circuit design with a high-pass filter (HPF) added to the compensation circuit 400 shown in FIG. 4.

Figure 5:
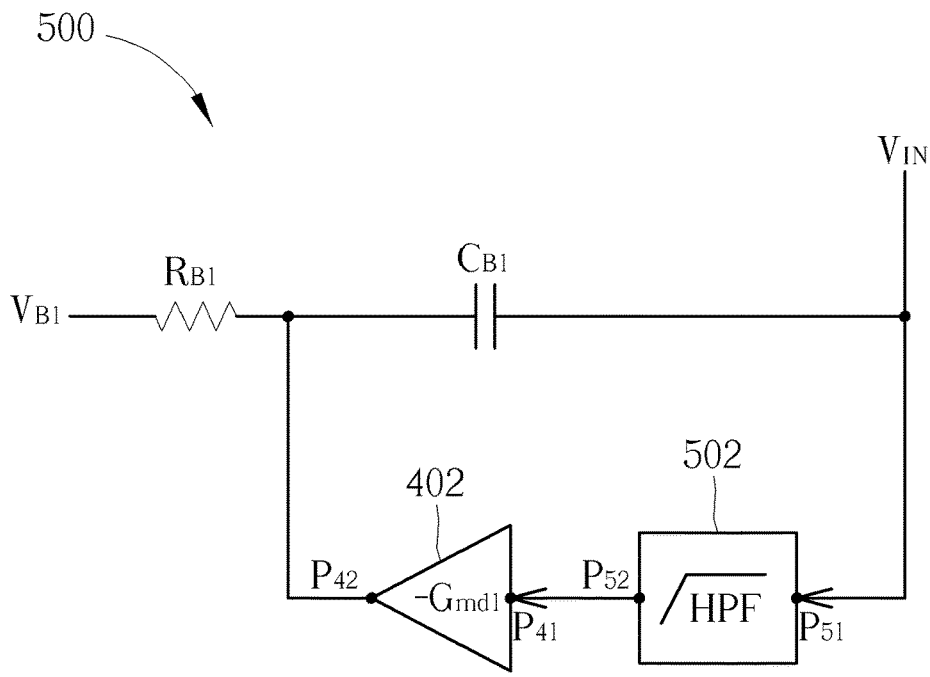
FIG. 5 is a diagram illustrating a second compensation circuit design according to an embodiment of the present invention.

FIG. 5 is a diagram illustrating a second compensation circuit design according to an embodiment of the present invention. The major difference between the compensation circuits 400 and 500 is that the compensation circuit 500 has a high-pass filter (HPF) 502 included therein, where an input port $P_{51}$ of the HPF 502 is coupled to the input $V_{IN}$ of the compensation circuit 500, and an output port $P_{52}$ of the HPF 502 is coupled to the input port $P_{41}$ of the auxiliary amplifier 402. An in-band signal with a large swing may be attenuated by the HPF 502 to fall within the small signal range of the auxiliary amplifier 402 with large transconductance $G_{md1}$. Hence, amplifier saturation may not occur when a large-swing in-band signal at the input $V_{IN}$ of the compensation circuit 400 is amplified by the auxiliary amplifier 402 with large transconductance $G_{md1}$. The in-band signal range of the compensation circuit 500 can be large due to the HPF 502. In addition, the compensation circuit 500 has high input impedance due to the fact that the input $V_{IN}$ of the compensation circuit 400 is coupled to the input port P41 of the auxiliary amplifier 402 via the HPF 502. Regarding the amplifier circuit 100 shown in FIG. 1, high impedance is required at an output of the first-stage amplifier 114 (i.e., an input of the second-stage amplifier 116) for low noise injection. Hence, the first compensation circuit 104_1 may be implemented using the compensation circuit 500 shown in FIG. 5, where the input $V_{IN}$ of the compensation circuit 500 is coupled to the output port $P_{12}$ of the first-stage amplifier 114.

Figure 6:
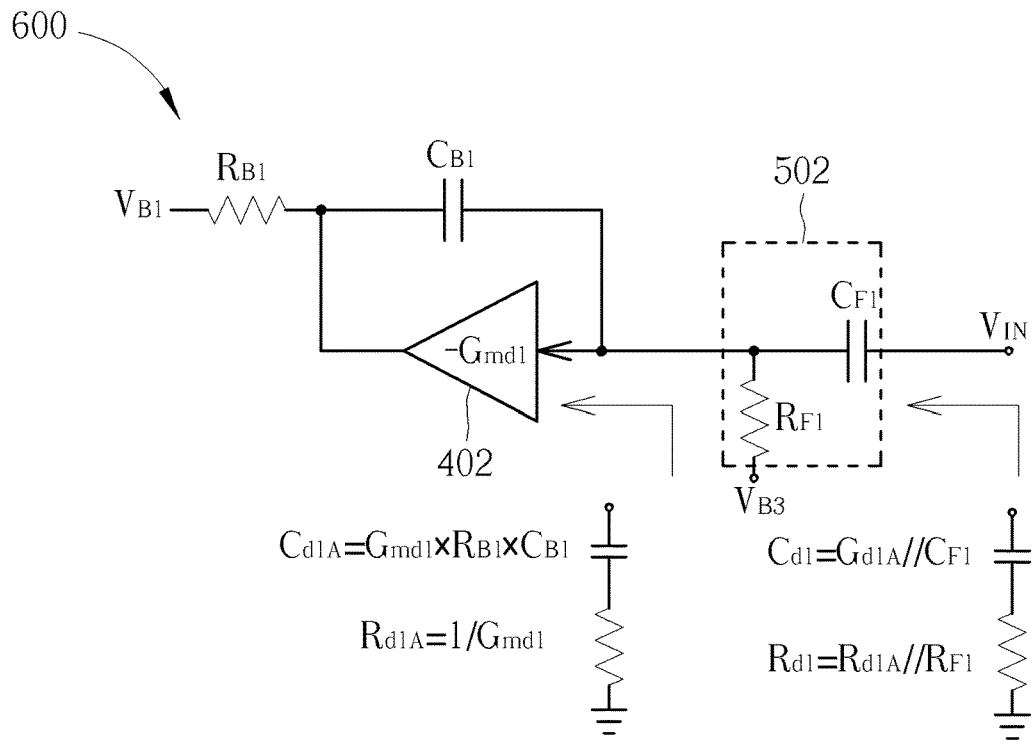
FIG. 6 is a diagram illustrating a compensation circuit with a high-pass filter located outside of a loop formed by an auxiliary amplifier and a capacitor.
Figure 7:
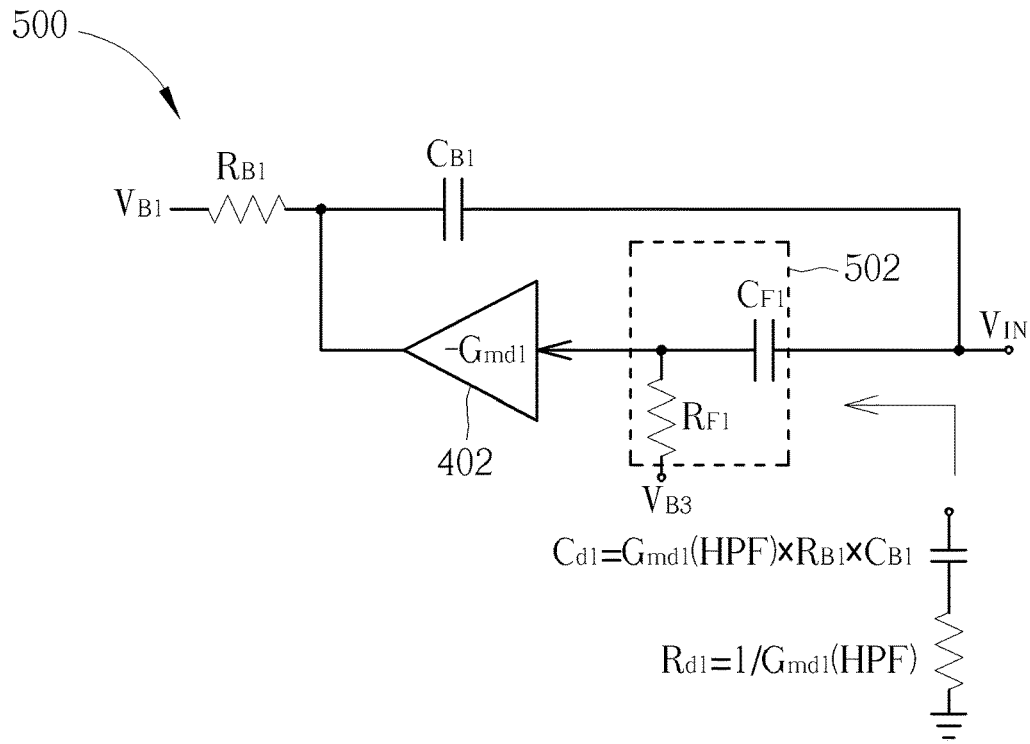
FIG. 7 is a diagram illustrating a compensation circuit with a high-pass filter located in a loop formed by an auxiliary amplifier and a capacitor.

It should be noted that, to achieve the desired damping operation, the compensation circuit 500 is required to have the HPF 502 located in a loop formed by the auxiliary amplifier 402 and the capacitor $C_{B1}$. Please refer to FIG. 6 in conjunction with FIG. 7. FIG. 6 is a diagram illustrating a compensation circuit with an HPF located outside of a loop formed by an auxiliary amplifier and a capacitor. FIG. 7 is a diagram illustrating a compensation circuit with an HPF located in a loop formed by an auxiliary amplifier and a capacitor. As shown in FIG. 6, the compensation circuit 600 has the HPF 502 located outside of the loop formed by the auxiliary amplifier 402 and the capacitor $C_{B1}$. The capacitance $C_{d1A}$ looking into the auxiliary amplifier 402 is $G_{md1}*R_{B1}*C_{B1}$, and the resistance $R_{d1A}$ looking into the auxiliary amplifier 402 is $$\frac{1}{G_{md1}}.$$

The HPF 502 may be implemented using a resistor $R_{F1}$ and a capacitor $C_{F1}$. Since the HPF 502 is located outside of the loop formed by the auxiliary amplifier 402 and the capacitor $C_{B1}$, the capacitance $C_{d1}$ looking into the HPF 502 is $C_{d1A}\|C_{F1}$, and the resistance $R_{d1}$ looking into the HPF 502 is $R_{d1A}\|R_{F1}$. Consequently, the HPF $f_{-3\ dB}$ corner shifts due to the load effect, and the capacitance multiplication operation fails due to $C_{F1}$ effect.

As shown in FIG. 7, the compensation circuit 500 has the HPF 502 located in the loop formed by the auxiliary amplifier 402 and the capacitor $C_{B1}$. As mentioned above, the HPF 502 may be implemented using the resistor $R_{F1}$ and the capacitor $C_{F1}$. Since the HPF 502 is located in the loop formed by the auxiliary amplifier 402 and the capacitor $C_{B1}$, the capacitance $C_{d1}$ looking into the HPF 502 is $G_{md1}(HPF)*R_{B1}*C_{B1}$, and the resistance $R_{d1}$ looking into the HPF 502 is $$\frac{1}{G_{md1}(HPF)}.$$

For a low-frequency signal, both of the equivalent capacitor $G_{md1}(HPF)*R_{B1}*C_{B1}$ and equivalent resistor $$\frac{1}{G_{md1}(HPF)}$$

are open-circuited. For a high-frequency signal, the compensation circuit 500 present an amplified capacitance of $G_{md1}$(HPF)*$R_{B1}$*$C_{B1}$ to control the unity-gain bandwidth. There is no load effect jeopardizing the capacitance multiplication operation.

Figure 8:
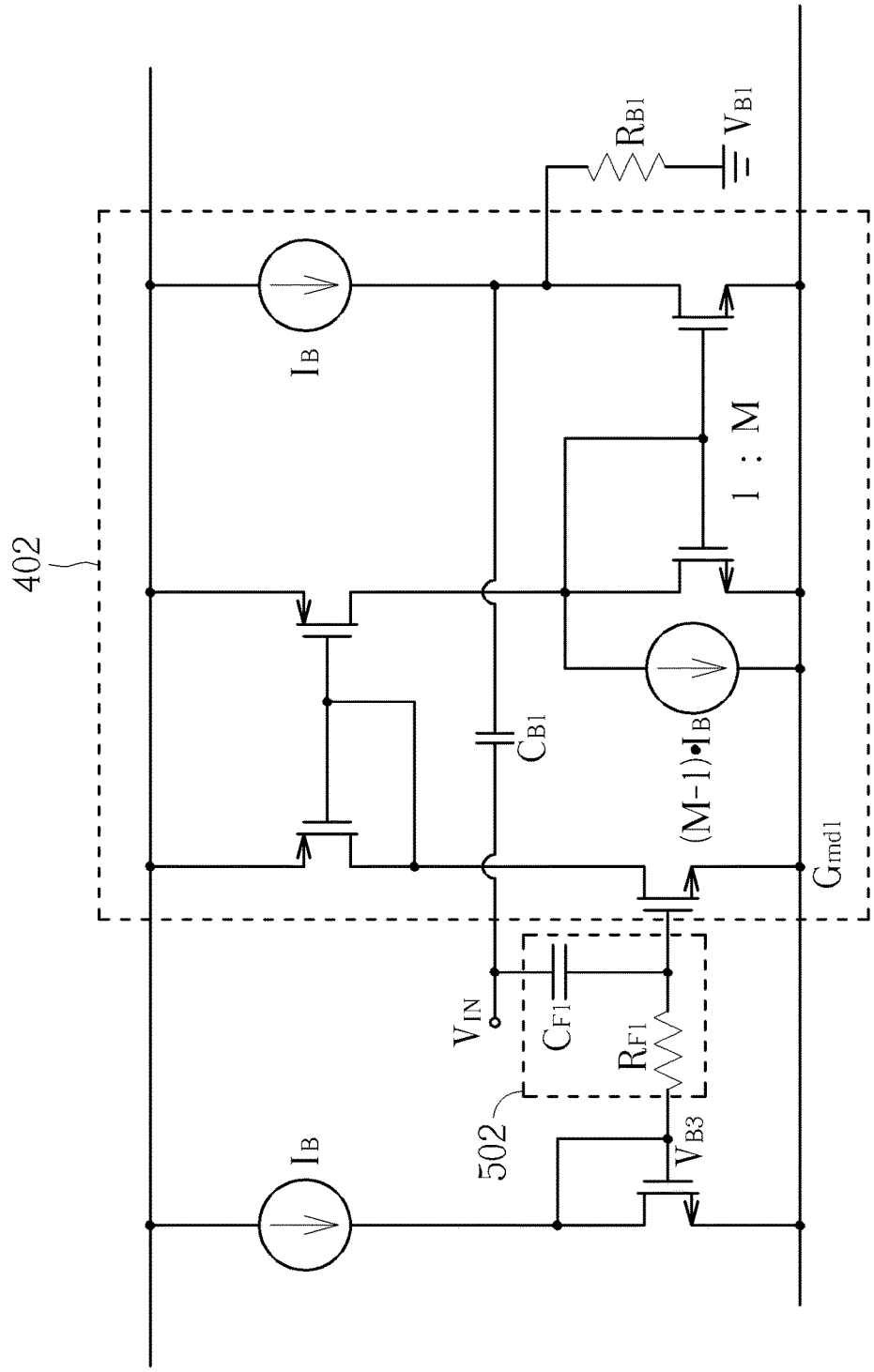
FIG. 8 is a circuit diagram of a compensation circuit shown in FIG. 5/FIG. 7 according to an embodiment of the present invention.

FIG. 8 is a circuit diagram of the compensation circuit 500 shown in FIG. 5/FIG. 7 according to an embodiment of the present invention. As shown in FIG. 8, one end of the capacitor $C_{B1}$ and one end of the capacitor $C_{F1}$ are both coupled to the input $V_{IN}$, another end of the capacitor $C_{F1}$ is coupled to a gate of an input transistor of the auxiliary amplifier 402, and another end of the capacitor $C_{B1}$ is coupled to a drain of an output transistor of the auxiliary amplifier 402. Hence, the HPF 502 is located in the loop formed by the capacitor $C_{B1}$ and the auxiliary amplifier 402, thus avoiding the load effect. It should be noted that the circuit design of the auxiliary amplifier 402 shown in FIG. 8 is for illustrative purposes only, and is not meant to be a limitation of the present invention. That is, in some embodiments of the present invention, the auxiliary amplifier 402 may be implemented using a circuit design different from that shown in FIG. 8.

Figure 9:
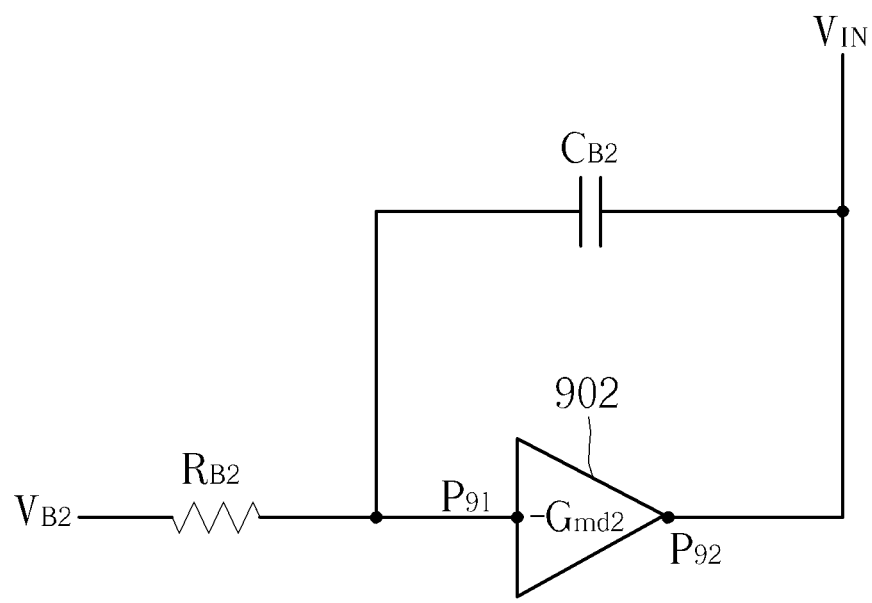
FIG. 9 is a diagram illustrating a third compensation circuit design according to an embodiment of the present invention.

FIG. 9 is a diagram illustrating a third compensation circuit design according to an embodiment of the present invention. The compensation circuit 900 includes an auxiliary amplifier 902 with transconductance $G_{md2}$, a capacitor $C_{B2}$, and a resistor $R_{B2}$. In this embodiment, the gain of the auxiliary amplifier 902 is negative. An output port $P_{92}$ of the auxiliary amplifier 902 is coupled to an input $V_{IN}$ of the compensation circuit 900. The capacitor $C_{B2}$ is coupled between the input port $P_{91}$ and an output port $P_{92}$ of the auxiliary amplifier 902. The resistor $R_{B2}$ is coupled between the input port $P_{91}$ of the auxiliary amplifier 902 and a bias voltage $V_{B2}$ (e.g., a ground voltage). The compensation circuit 900 is suitable for a large-swing signal at the input $V_{IN}$ of the compensation circuit 900. Regarding the amplifier circuit 100 shown in FIG. 1, an output of the second-stage amplifier 116 (which is also an input of the third-stage amplifier 118) may have a large swing for Class-AB operation. Hence, the second compensation circuit 104_2 may be implemented using the compensation circuit 900 shown in FIG. 9, where the input $V_{IN}$ of the compensation circuit 900 is coupled to the output port $P_{22}$ of the second-stage amplifier 116. However, this is for illustrative purposes only, and is not meant to be a limitation of the present invention. In some embodiments of the present invention, the second compensation circuit 104_2 may be implemented using the compensation circuit 400/500, such that the output of the second-stage amplifier 116 (which is also the input of the third-stage amplifier 118) may benefit from the high impedance offered by the compensation circuit 400/500. These alternative designs all fall within the scope of the present invention.

Figure 10:
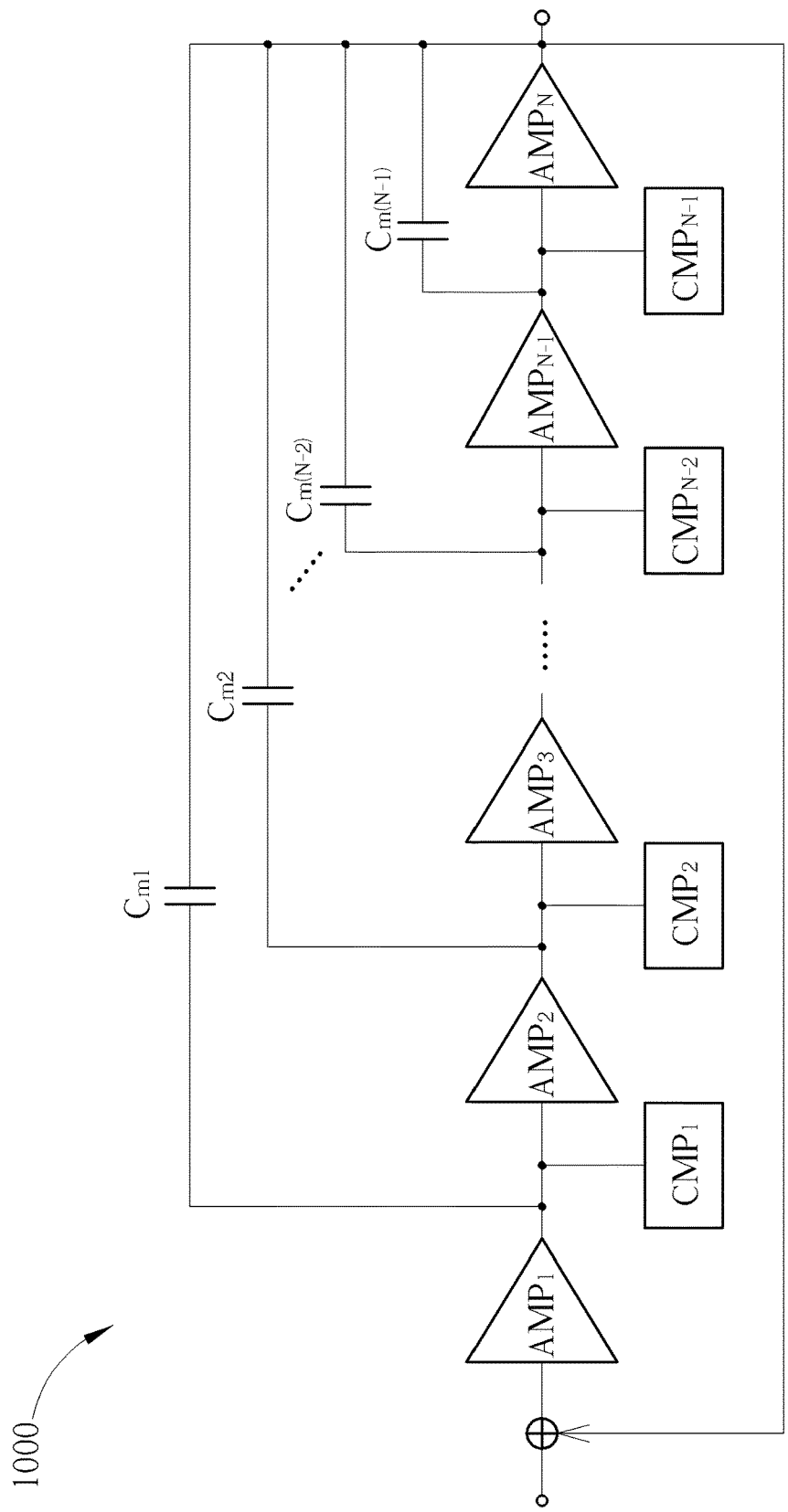
FIG. 10 is a diagram illustrating another amplifier circuit according to an embodiment of the present invention.

The multi-stage amplifier used in the amplifier circuit 100 is a three-stage amplifier. However, the same frequency response (unity-gain-bandwidth control) scheme can be extended and applied to a multi-stage amplifier having more than three amplifier stages. FIG. 10 is a diagram illustrating another amplifier circuit according to an embodiment of the present invention. By way of example, but not limitation, the amplifier circuit 1000 may be used in an audio application. As shown in FIG. 1, the amplifier circuit 100 is a multi-stage amplifier circuit including an N-stage amplifier composed of amplifiers $AMP_1$-$AMP_N$, (N−1) compensation circuits $CMP_1$-$CMP_{N-1}$, and (N−1) compensation capacitors $C_{m1}$-$C_{m(N-1)}$, where N is a positive integer larger than 3 (i.e., N>3). Each of the compensation capacitors $C_{m1}$-$C_{m(N-1)}$ is used for Miller compensation. However, regarding the proposed frequency compensation (unity-gain-bandwidth control) scheme, the compensation capacitors $C_{m2}$-$C_{m(N-1)}$ are optional. In other words, in some embodiments of the present invention, the compensation capacitors $C_{m2}$-$C_{m(N-1)}$ can be omitted, depending upon the actual design considerations. The compensation circuit $CMP_1$ may be implemented using the compensation circuit 400/500. Each of the compensation circuits $CMP_2$-$CMP_{N-1}$ may be implemented using one of the compensation circuits 400, 500 and 900, depending upon the actual design considerations. In accordance with the proposed frequency response (unity-gain-bandwidth control) scheme, at least one zero and at least one pole can be inserted by compensation circuits $CMP_1$-$CMP_{N-1}$. In this way, the amplifier circuit 100 can have enhanced stability without in-band gain degradation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An amplifier circuit comprising:
 a multi-stage amplifier, comprising a plurality of amplifiers cascaded between an input port and an output port of the multi-stage amplifier, wherein the amplifiers comprise at least a first-stage amplifier, a second-stage amplifier and a third-stage amplifier;
 a compensation capacitor, coupled between the output port of the multi-stage amplifier and an output port of the first-stage amplifier; and
 a plurality of compensation circuits, comprising:
  a first compensation circuit, coupled to the output port of the first-stage amplifier; and
  a second compensation circuit, coupled to an output port of the second-stage amplifier;
 wherein the first compensation circuit and the second compensation circuit are arranged to insert at least a zero and a pole, and an open-loop gain of the amplifier circuit is larger than one at each of the zero and the pole.

2. The amplifier circuit of claim 1, wherein a frequency of the pole is lower than a frequency of the zero.

3. The amplifier circuit of claim 2, wherein a shrink factor of a unity-gain bandwidth (UGB) of the amplifier circuit depends on a ratio of the frequency of the zero to the frequency of the pole.

4. The amplifier circuit of claim 2, wherein the amplifier circuit is unconditionally stable in a closed-loop operation due to the zero and the pole inserted by the first compensation circuit and the second compensation circuit.

5. The amplifier circuit of claim 1, wherein the first compensation circuit is a damping-factor-control (DFC) circuit.

6. The amplifier circuit of claim 1, wherein the second compensation circuit is a damping-factor-control (DFC) circuit.

7. The amplifier circuit of claim 1, wherein the first compensation circuit comprises:
 an auxiliary amplifier, having an input port coupled to the output port of the first-stage amplifier;
 a capacitor, coupled between an output port and the input port of the auxiliary amplifier; and
 a resistor, coupled between the output port of the auxiliary amplifier and a bias voltage.

8. The amplifier circuit of claim 1, wherein the first compensation circuit comprises:

a high-pass filter (HPF), having an input port coupled to the output port of the first-stage amplifier;

an auxiliary amplifier, having an input port coupled to an output port of the HPF;

a capacitor, coupled between the input port of the HPF and an output port of the auxiliary amplifier; and a resistor, coupled between the output port of the auxiliary amplifier and a bias voltage.

9. The amplifier circuit of claim 1, wherein the second compensation circuit comprises:

an auxiliary amplifier, having an output port coupled to the output port of the second-stage amplifier;

a capacitor, coupled between the output port and an input port of the auxiliary amplifier; and a resistor, coupled between the input port of the auxiliary amplifier and a bias voltage.

10. The amplifier circuit of claim 1, wherein the second compensation circuit comprises:

an auxiliary amplifier, having an input port coupled to the output port of the second-stage amplifier;

a capacitor, coupled between the output port and an input port of the auxiliary amplifier; and a resistor, coupled between the output port of the auxiliary amplifier and a bias voltage.

11. The amplifier circuit of claim 1, wherein the second compensation circuit comprises:

a high-pass filter (HPF), having an input port coupled to the output port of the second-stage amplifier;

an auxiliary amplifier, having an input port coupled to an output port of the HPF;

a capacitor, coupled between the input port of the HPF and an output port of the auxiliary amplifier; and a resistor, coupled between the output port of the auxiliary amplifier and a bias voltage.

12. A compensation circuit comprising:

a high-pass filter (HPF), having an input port and an output port, wherein the input port of the HPF is coupled to an output port of one amplifier included in a multi-stage amplifier;

an auxiliary amplifier, having an input port coupled to the output port of the HPF;

a capacitor, coupled between the input port of the HPF and an output port of the auxiliary amplifier; and a resistor, coupled between the output port of the auxiliary amplifier and a bias voltage.

13. The compensation circuit of claim 12, wherein the compensation circuit is a damping-factor-control (DFC) circuit.

14. The compensation circuit of claim 12, wherein said one amplifier is a first-stage amplifier in the multi-stage amplifier.

* * * * *